(12) United States Patent
Jeon et al.

(10) Patent No.: US 11,217,652 B2
(45) Date of Patent: Jan. 4, 2022

(54) DISPLAY DEVICE WITH FAN-OUT LINES IN REDUCED PERIPHERAL AREA

(71) Applicant: Samsung Display Co., Ltd., Yongin-si (KR)

(72) Inventors: Yujin Jeon, Yongin-si (KR); Wonse Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 39 days.

(21) Appl. No.: 16/820,470

(22) Filed: Mar. 16, 2020

(65) Prior Publication Data

US 2020/0321421 A1    Oct. 8, 2020

(30) Foreign Application Priority Data

Apr. 2, 2019  (KR) .................. 10-2019-0038605

(51) Int. Cl.
*H01L 27/32* (2006.01)

(52) U.S. Cl.
CPC ...... *H01L 27/3276* (2013.01); *H01L 27/3248* (2013.01)

(58) Field of Classification Search
CPC .................. H01L 27/3276; H01L 27/3248
See application file for complete search history.

(56) References Cited

U.S. PATENT DOCUMENTS

| | | | |
|---|---|---|---|
| 8,436,376 B2 * | 5/2013 | Bang | ............... H01L 51/5228 257/91 |
| 8,766,323 B2 | 7/2014 | Kim et al. | |
| 9,153,631 B2 | 10/2015 | Sung et al. | |
| 9,960,217 B2 | 5/2018 | Su et al. | |
| 10,014,491 B2 | 7/2018 | Park | |
| 10,121,986 B2 * | 11/2018 | Lee | ................. H01L 27/3246 |
| 2005/0098785 A1 * | 5/2005 | You | ................. G02F 1/136227 257/72 |
| 2008/0191603 A1 * | 8/2008 | Kubota | ............ H01L 51/5228 313/498 |
| 2014/0203307 A1 * | 7/2014 | Su | ................. H01L 27/3246 257/88 |

(Continued)

FOREIGN PATENT DOCUMENTS

| KR | 10-2015-0001012 A | 1/2015 |
|---|---|---|
| KR | 10-2017-0014728 A | 2/2017 |

(Continued)

*Primary Examiner* — Lex H Malsawma

(74) *Attorney, Agent, or Firm* — Lewis Roca Rothgerber Christie LLP

(57) ABSTRACT

A display device includes: a substrate including a display area, a peripheral area, and a pad area, a plurality of pixels in the display area, and the peripheral area surrounding the display area; a plurality of fan-out lines extending from the pad area to the display area; a first metal layer covering at least a portion of the plurality of fan-out lines in the peripheral area; a second metal layer overlapping at least a portion of the first metal layer, the second metal layer being over the first metal layer; a third metal layer over the second metal layer in the peripheral area; a first insulating layer between the first metal layer and the second metal layer and including first contact holes; and a second insulating layer between the second metal layer and the third metal layer and including second contact holes.

21 Claims, 11 Drawing Sheets

(56) References Cited

U.S. PATENT DOCUMENTS

| | | | | |
|---|---|---|---|---|
| 2015/0008400 A1* | 1/2015 | Kim | ........................ | H01L 51/56 |
| | | | | 257/40 |
| 2018/0261657 A1* | 9/2018 | Kim | .................... | H01L 51/5253 |
| 2019/0341439 A1* | 11/2019 | Choi | .................... | G09G 3/3291 |
| 2020/0273940 A1* | 8/2020 | Byun | .................. | H01L 27/3276 |

FOREIGN PATENT DOCUMENTS

| KR | 10-2017-0047452 A | 5/2017 |
|---|---|---|
| KR | 10-1800285 B1 | 12/2017 |

\* cited by examiner

DISPLAY DEVICE WITH FAN-OUT LINES IN REDUCED PERIPHERAL AREA

CROSS-REFERENCE TO RELATED APPLICATION

This application claims priority to and the benefit of Korean Patent Application No. 10-2019-0038605, filed on Apr. 2, 2019, in the Korean Intellectual Property Office, the disclosure of which is incorporated herein in its entirety by reference.

BACKGROUND

1. Field

Aspects of one or more example embodiments relate to a display device.

2. Description of the Related Art

An organic light-emitting display device includes an organic light-emitting diode including a hole injection electrode, an electron injection electrode, and an organic emission layer therebetween. The organic light-emitting display device is a self-luminous display device that emits light while an exciton falls from an excited state to a ground state, the exciton being generated when a hole injected from the hole injection electrode and an electron injected from the electron injection electrode combine in the organic emission layer.

Because the organic light-emitting display device, which is a self-luminous display device, does not require a separate light source, the organic light-emitting display device may be driven at a low voltage and may be configured with a relatively lightweight and slim profile and may have high-quality characteristics such as relatively wide viewing angles, relatively high contrast, and relatively fast response speeds. Therefore, the organic light-emitting display device is in the limelight as the next generation display device.

Recently, increasing a display area, which is an area through which a user recognizes an image, has emerged as an important issue in display devices. To increase the display area, a peripheral area outside the display area may be reduced. In this case, as the peripheral area is reduced, an interval of a wiring located in the peripheral area may also be reduced and thus the wiring may be disconnected or overheated.

The above information disclosed in this Background section is only for enhancement of understanding of the background and therefore the information discussed in this Background section does not necessarily constitute prior art.

SUMMARY

One or more example embodiments include a display device that may prevent or reduce instances of a defect such as disconnection of a wiring in a peripheral area outside a display area. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to some example embodiments, a display device includes: a substrate including a display area, a peripheral area, and a pad area outside the peripheral area, a plurality of pixels in the display area, and the peripheral area surrounding the display area; a plurality of fan-out lines extending from the pad area to the display area across the peripheral area, the plurality of fan-out lines transferring an image signal to the plurality of pixels; a first metal layer covering at least a portion of the plurality of fan-out lines in the peripheral area; a second metal layer overlapping at least a portion of the first metal layer, the second metal layer being over the first metal layer; a third metal layer arranged over the second metal layer in the peripheral area; a first insulating layer arranged between the first metal layer and the second metal layer and including first contact holes; a second insulating layer arranged between the second metal layer and the third metal layer and including second contact holes; and a third insulating layer arranged between the plurality of fan-out lines and the first metal layer, wherein the first metal layer and the second metal layer contact each other in the first contact hole, the second metal layer and the third metal layer contact each other in the second contact hole, and the second contact holes are arranged between the first contact holes that neighbor each other.

According to some example embodiments, the third insulating layer may have grooves corresponding to an intermediate area between the plurality of fan-out lines that neighbor each other, and the first contact holes may be arranged between the grooves.

According to some example embodiments, the third insulating layer may have grooves corresponding to an intermediate area between the plurality of fan-out lines that neighbor each other, and the first metal layer and the second metal layer may contact each other in the groove.

According to some example embodiments, at least one of the first insulating layer or the second insulating layer may include an organic insulating material.

According to some example embodiments, the second metal layer may include a plurality of holes apart from the first contact holes, and the second contact holes may be apart from each of the first contact holes and the plurality of holes.

According to some example embodiments, the plurality of holes may have a size greater than those of the first contact holes and the second contact holes.

According to some example embodiments, the first contact holes may have an area greater than those of the second contact holes.

According to some example embodiments, the plurality of pixels may include: a thin film transistor; a pixel electrode electrically connected to at least one of a source electrode or a drain electrode of the thin film transistor; an opposite electrode over the pixel electrode; and an emission layer between the pixel electrode and the opposite electrode.

According to some example embodiments, the third metal layer may constitute one body with the opposite electrode.

According to some example embodiments, the first metal layer may be arranged on the same layer as a layer on which the source electrode and the drain electrode of the thin film transistor are arranged.

According to some example embodiments, at least some of the plurality of fan-out lines may be arranged on the same layer as a layer on which a gate electrode of the thin film transistor is arranged.

According to some example embodiments, the display device may further include: an auxiliary metal connecting the pixel electrode and at least one of the source electrode or the drain electrode of the thin film transistor, wherein the second metal layer may be arranged on the same layer as a layer on which the auxiliary metal is arranged.

According to some example embodiments, the plurality of fan-out lines may include a first fan-out line and a second fan-out line, the first fan-out line and the second fan-out line being arranged on different layers.

According to some example embodiments, a display device includes: a substrate including a display area, a peripheral area, and a pad area outside the peripheral area, a plurality of pixels in the display area, and the peripheral area surrounding the display area; a plurality of fan-out lines extending from the pad area to the display area across the peripheral area, the plurality of fan-out lines being apart from each other in a first direction in the peripheral area; a first metal layer covering at least a portion of the plurality of fan-out lines in the peripheral area; a second metal layer overlapping at least a portion of the first metal layer, the second metal layer being over the first metal layer in the peripheral area; an opposite electrode arranged in common over the plurality of pixels, the opposite electrode being over the second metal layer; a first insulating layer arranged between the first metal layer and the second metal layer and including first contact holes; a second insulating layer arranged between the second metal layer and the opposite electrode and including second contact holes; and a third insulating layer arranged between the plurality of fan-out lines and the first metal layer and including grooves corresponding to an intermediate area between the plurality of fan-out lines that neighbor each other, wherein a separation distance in the first distance between the first contact hole and the groove is different from a separation distance in the first direction between the second contact hole and the groove.

According to some example embodiments, the second metal layer may include a plurality of holes apart from each other, and a separation distance in the first direction between the first contact hole and the hole may be different from a separation distance in the first direction between the second contact hole and the hole.

According to some example embodiments, the plurality of pixels may include: a thin film transistor; a pixel electrode electrically connected to at least one of a source electrode or a drain electrode of the thin film transistor; and an emission layer between the pixel electrode and the opposite electrode.

According to some example embodiments, the first metal layer may be arranged on the same layer as a layer on which the source electrode and the drain electrode of the thin film transistor are arranged.

According to some example embodiments, at least some of the plurality of fan-out lines may be arranged on the same layer as a layer on which a gate electrode of the thin film transistor is arranged.

According to some example embodiments, the display device may further include: an auxiliary metal connecting the pixel electrode and at least one of the source electrode or the drain electrode of the thin film transistor, wherein the second metal layer may be arranged on the same layer as a layer on which the auxiliary metal is arranged.

According to some example embodiments, the plurality of fan-out lines may include a first fan-out line and a second fan-out line, the first fan-out line and the second fan-out line being arranged on different layers.

BRIEF DESCRIPTION OF THE DRAWINGS

These and/or other aspects will become more apparent and more readily appreciated from the following description of the example embodiments, taken in conjunction with the accompanying drawings in which.

DETAILED DESCRIPTION

Figure 1:
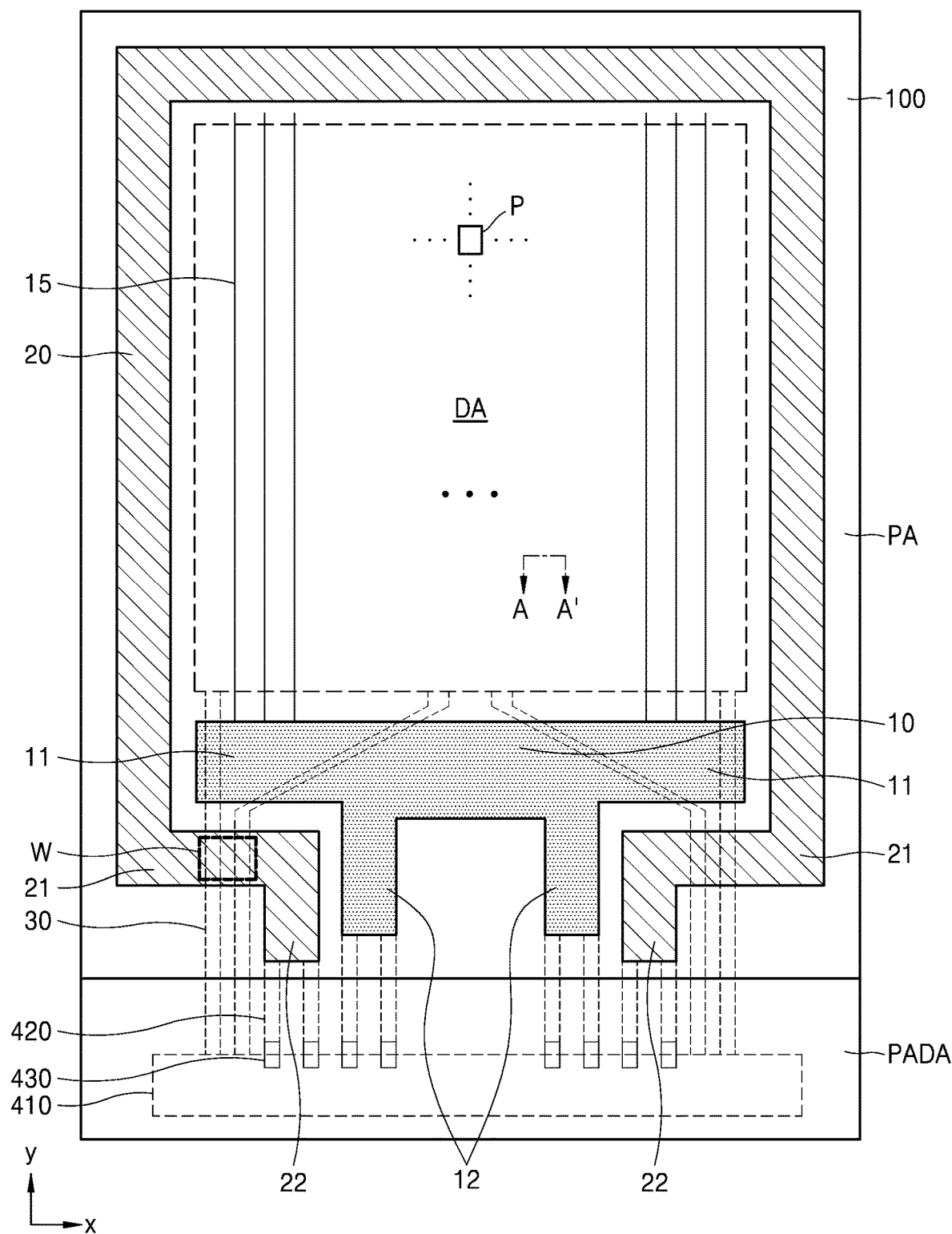
FIG. 1 is a plan view of a display device according to some example embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, aspects of some example embodiments will be illustrated in the drawings and described in more detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the present disclosure.

While such terms as "first," "second," etc., may be used to describe various components, such components must not be limited to the above terms. The above terms are used only to distinguish one component from another.

It will be understood that when a layer, region, or component is referred to as being "formed on," another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, aspects of some example embodiments according to the present disclosure are described in more detail with reference to the drawings. In describing with reference to the drawings, same reference numerals are used for substantially same or corresponding elements and repeated description thereof is omitted. In the drawings, thicknesses are enlarged so as to clearly express a plurality of layers and regions. Also, in the drawings, for convenience of description, thicknesses of some of layers or regions are exaggerated.

Figure 2:
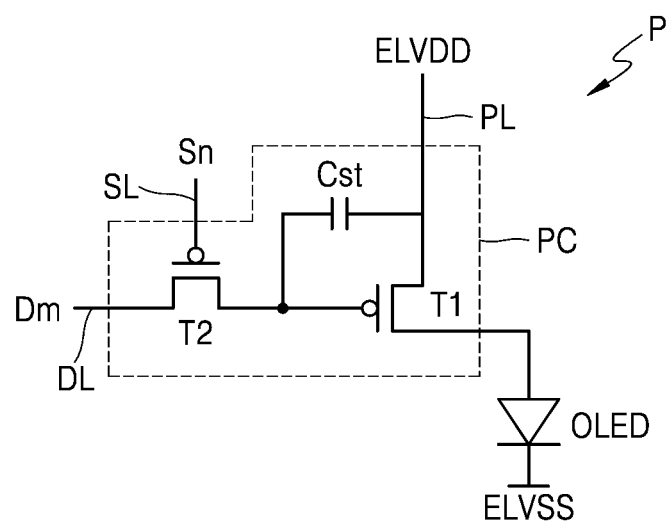
FIG. 2 is an equivalent circuit diagram of one of the pixels included in the display device of FIG. 1.

FIG. 1 is a plan view of a display device according to some example embodiments, and FIG. 2 is an equivalent circuit diagram of one of the pixels included in the display device of FIG. 1.

Referring to FIGS. 1 and 2, the display device 1000 according to some example embodiments includes a substrate 100 including a display area DA, a peripheral area PA, and a pad area PADA.

The display area DA is an area that displays an image recognizable by a user, the peripheral area PA is a non-display area that surrounds the display area DA, and the pad area PADA is an area located outside the display area DA and the peripheral area PADA.

A plurality of pixels P are arranged in the display area DA. FIG. 2 shows an example of an equivalent circuit diagram of one of the pixels. Referring to FIG. 2, a pixel P may include a pixel circuit PC and a display element connected to the pixel circuit PC, the pixel circuit PC being connected to a scan line SL and a data line DL. For example, the display element may include an organic light-emitting diode OLED.

Each pixel P includes the pixel circuit PC and the organic light-emitting diode OLED connected to the pixel circuit PC, the pixel circuit PC being connected to a scan line SL and a data line DL.

The pixel circuit PC includes a driving thin film transistor T1, a switching thin film transistor T2, and a storage capacitor Cst. The switching thin film transistor T2 is connected to a scan line SL and a data line DL. The switching thin film transistor T2 transfers a data signal Dm input through the data line DL to the driving thin film transistor T1 in response to a scan signal Sn input through the scan line SL.

The storage capacitor Cst is connected to the switching thin film transistor T2 and a driving voltage line PL and stores a voltage corresponding to a difference between a voltage transferred from the switching thin film transistor T2 and a first power voltage ELVDD (or a driving voltage) supplied through the driving voltage line PL.

The driving thin film transistor T1 may be connected to the driving voltage line PL and the storage capacitor Cst and may control a driving current flowing through an organic light-emitting diode OLED from the driving voltage line PL in response to the voltage stored in the storage capacitor Cst. The organic light-emitting diode OLED may emit light having predetermined brightness by using the driving current.

Though FIG. 2 describes the case where one pixel P includes two thin film transistors and one storage capacitor, the embodiments are not limited thereto. According to some example embodiments, a pixel circuit PC of a pixel P may include three or more thin film transistors or two or more storage capacitors. Various modifications may be made.

Referring to FIG. 1 again, various wirings connected to the plurality of pixels P in the display area DA may pass across the peripheral area PA. An encapsulation member for encapsulating the display area DA may be arranged in the peripheral area PA. The encapsulation member may include a sealing member surrounding the display area DA.

A first power voltage line 10 and a second power voltage line 20 may be arranged in the peripheral area PA, the first power voltage line 10 and the second power voltage line 20 each supplying power for driving a display element (e.g., the organic light-emitting diode OLED of FIG. 2) of a pixel P.

The first power voltage line 10 may include a driving voltage line ELVDD, and the second power voltage line 20 may include a common voltage line ELVSS. The first power voltage line 10 may be connected to a subordinate voltage line that supplies a driving voltage to a pixel P, and the second power voltage line 20 may be connected to an opposite electrode 223 (see FIG. 4) directly or by way of a different wiring.

For example, the first power voltage line 10 may be arranged between the pad area PADA and one edge of the display area DA. The second power voltage line 20 may be arranged to correspond to the other edges of the display area DA except the one edge of the display area DA. For example, the second voltage line 20 may surround the rest of the edges of the display area DA except the one edge of the display area DA in which the first voltage line 10 is arranged.

The first voltage line 10 extends to correspond to one edge of the display area DA and may include a main voltage line and a first connect portion 12 connected to the main voltage line, the main voltage line having two opposite end portions 11. In this case, the one edge of the display area DA may include an edge of the display area DA that is adjacent to the pad area PADA.

The first connect portion 12 may protrude from the main voltage line and extend in a second direction (a y-direction). Here, the second direction (the y-direction) denotes a direction from the display area DA to the pad area PADA, for example, a direction approximately perpendicular to the first direction (the x-direction). The first connect portion 12 may be connected to a pad 430 located in the pad area PADA and may electrically connect the first voltage line 10 to a driver integrated circuit (IC) 410. The pad 430 and the driver IC 410 are described below.

The second voltage line 20 may include a main voltage line and a second connect portion 22 bent from an end portion 21 of the main voltage line, the main voltage line surrounding the edges of the display area DA. For example, the end portion 21 of the main voltage line of the second voltage line 20 may extend in the first direction (the x-direction), the end portion 21 of the main voltage line corresponding to the main voltage line of the first voltage line 10. The second connect portion 22 of the second voltage line 20 may extend in the second direction (the y-direction), the second connect portion 22 of the second voltage line 20 corresponding to the first connect portion 12 of the first voltage line 10.

Similar to the first connect portion 12, the second connect portion 22 may be connected to the pad 430 located in the pad area PADA and may electrically connect the second voltage line 20 to the driver IC 410.

The pad area PADA is an area in which a power supply unit or a signal generator is arranged, the power supply unit and the signal generator transferring various electric signals and voltages to the plurality of pixels P in the display area DA.

The driver IC 410 may be arranged in the pad area PADA. The driver IC 410 may include a data driver for supplying a data signal and also include various functional units required for driving the pixel circuit PC (see FIG. 2). The driver IC 410 is mounted on the substrate 100 in a chip-on-glass (COG) type. The driver IC 410 includes a connection terminal on one side thereof, the connection terminal being electrically connected to the pad 430 formed on the substrate 100. A conductive ball may be arranged between the pad 430 and the connection terminal. That is, the pad 430 and the connection terminal may be bonded to each other with a conductive adhesive material therebetween. For such an adhesive material, an anisotropic conductive film and a self organizing conductive film may be used as an example.

Also, the pad 430 may be arranged in the pad area PADA, the pad 430 connecting various voltage lines, that is, the first voltage line 10 and the second voltage line 20 arranged in the peripheral area PA, to the driver IC 410. For this purpose, a pad connection line 420 may be provided to the pad 430. The pad 430 may include a single layer or a multi-layer including at least one of Mo, Al, Cu, Ag, or Ti.

A plurality of fan-out lines 30 may be arranged in the pad area PADA and the peripheral area PA. The plurality of fan-out lines 30 are connected to the driver IC 410 and extend from the driver IC 410 to the display area DA across the pad area PADA and the peripheral area PA. According to some example embodiments, like the voltage lines, that is, the first voltage line 10 and the second voltage line 20, the plurality of fan-out lines 30 may be connected to the driver IC 410 through the pad 430. Therefore, the plurality of fan-out lines 30 connect the driver IC 410 to the pixel circuit PC (see FIG. 2).

The plurality of fan-out lines 30 are apart from each other and transfer data signals to the plurality of pixels P arranged in the display area DA. For this purpose, the plurality of fan-out lines 30 may be connected to the data line DL (see FIG. 2) transferring a data signal to each of the plurality of pixels P.

The plurality of fan-out lines 30 may be arranged on a layer different from a layer on which the second voltage line 20 is arranged and may overlap a portion of the second voltage line 20. In this case, a portion in which the plurality of fan-out lines 30 and the second voltage line 20 overlap each other may be located in a portion of the peripheral area PA between the display area DA and the pad area PADA.

Though it is shown in FIG. 1 that the plurality of fan-out lines 30 overlap the end portion 21 of the main voltage line of the second voltage line 20, the embodiments are not limited thereto and the plurality of fan-out lines 30 may overlap at least a portion of the second connect portion 22 of the second voltage line 20.

A specific location relation (including a stacking structure) of the plurality of fan-out lines 30 and the second voltage line 20 is described below with reference to FIGS. 3 to 5.

Figure 3:
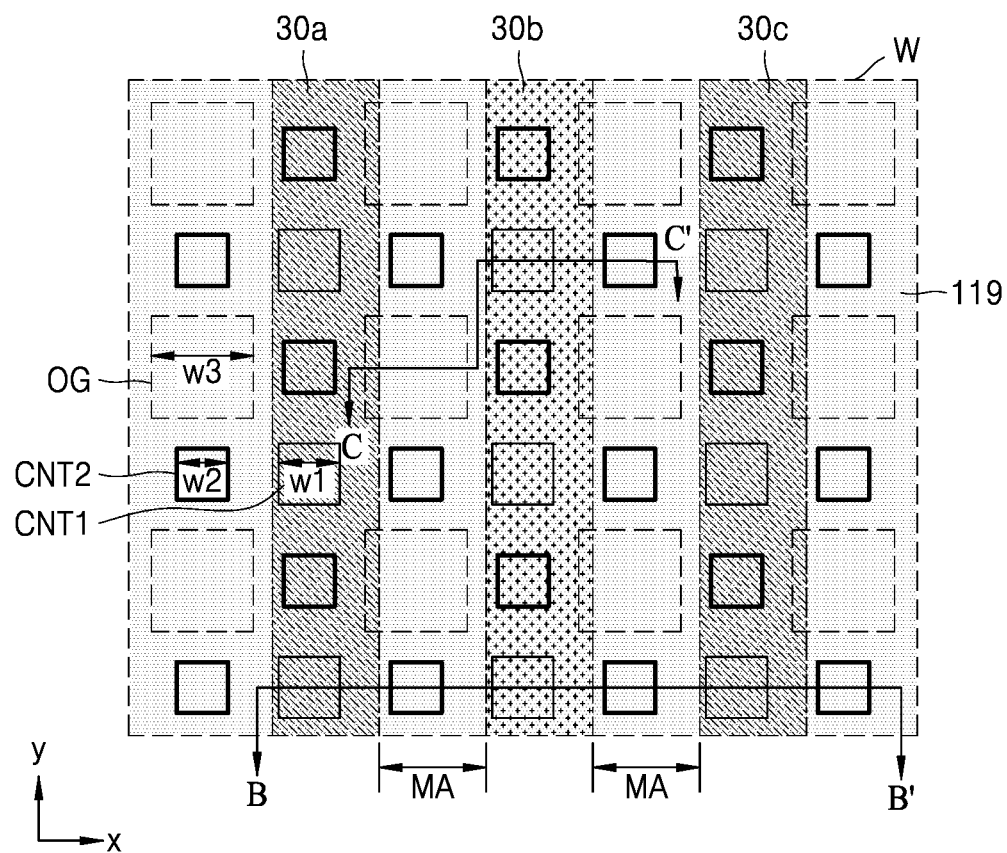
FIG. 3 is an enlarged plan view of an example of a region W of FIG. 1.
Figure 4A:
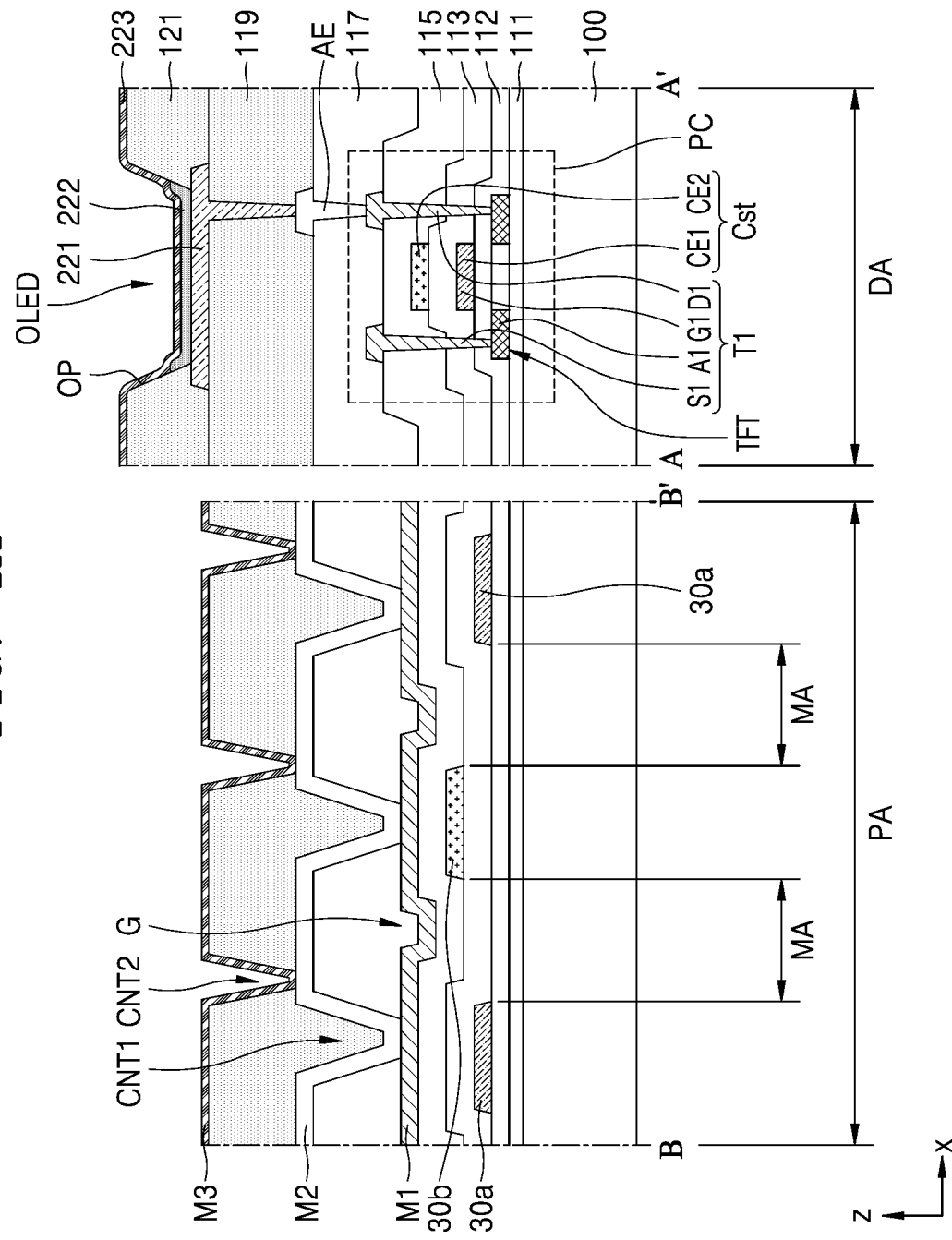
FIG. 4A is a cross-sectional view of the display device taken along the line A-A' of FIG. 1 and a cross-sectional view of the display device taken along the line B-B' of FIG. 3.
Figure 4B:
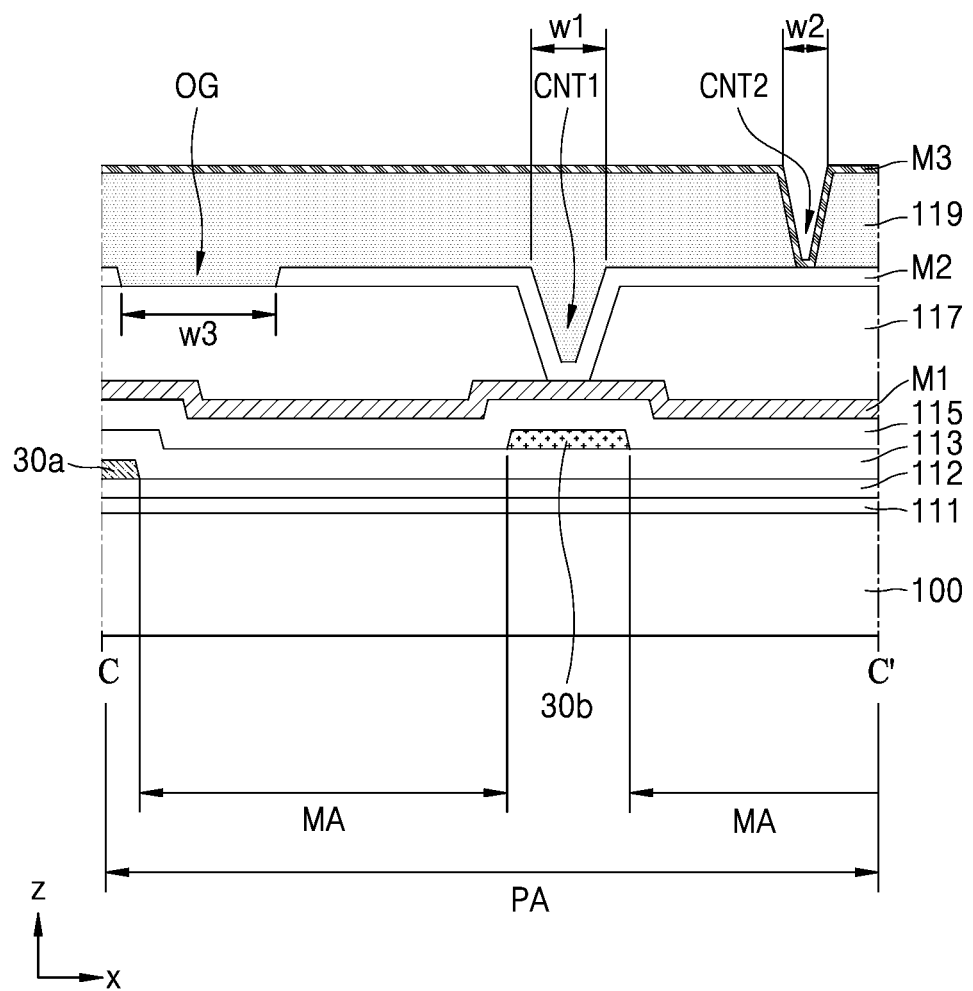
FIG. 4B is a cross-sectional view of the display device taken along the line C-C' of FIG. 3.

FIG. 3 is an enlarged plan view of an example of a region W of FIG. 1, FIG. 4A is a cross-sectional view of the display device taken along the line A-A' of FIG. 1 and a cross-sectional view of the display device taken along the line B-B' of FIG. 3, and FIG. 4B is a cross-sectional view of the display device taken along the line C-C' of FIG. 3.

The region W of FIG. 1 shown in FIG. 3 is a portion of the peripheral area PA (see FIG. 1) in which the plurality of fan-out lines 30 (see FIG. 1) and the second voltage line 20 overlap each other.

Referring to FIGS. 3 and 4A, the plurality of fan-out lines 30 (see FIG. 1) may be apart from each other on the substrate 100. The plurality of fan-out lines 30 (see FIG. 1) may include a first fan-out line 30a and a second fan-out line 30b, which may be arranged on different layers. However, the embodiments are not limited thereto and the first fan-out line 30a and the second fan-out line 30b may be arranged on the same layer.

Referring to a cross-section of the display device, shown in FIG. 4A, taken along a line A-A of FIG. 1, it is shown that the driving thin film transistor T1 and the storage capacitor Cst of the pixel circuit PC of each pixel P described with reference to FIG. 2 are provided in the display area DA. For convenience of description, a configuration arranged in the display area DA of FIG. 4A is described according to a stacking sequence.

The substrate 100 may include a glass material, a ceramic material, a metal material, or a flexible or bendable material. In the case where the substrate 100 is flexible or bendable, the substrate 100 may include a polymer resin. The substrate 100 may include a single-layered structure or a multi-layered structure including a polymer resin. In the case where the substrate 100 includes a multi-layered structure, the substrate 100 may further include an inorganic layer. According to some example embodiments, the substrate 100 may have a structure of an organic layer/inorganic layer/organic layer.

A semiconductor layer A1 may be arranged on a buffer layer 111. The semiconductor layer A1 may include amorphous silicon or polycrystalline silicon. According to some example embodiments, the semiconductor layer A1 may include an oxide semiconductor or an organic semiconductor. The semiconductor layer A1 may include a channel region and a source region and a drain region arranged on two opposite sides of the channel region. The semiconductor layer A1 may include a single layer or a multi-layer.

A gate electrode G1 is arranged over the semiconductor layer A1 with a gate insulating layer 112 therebetween such that the gate electrode G1 overlaps at least a portion of the semiconductor layer A1. The gate electrode G1 may include a single layer or a multi-layer including at least one of Mo, Al, Cu, or Ti. For example, the gate electrode G1 may include a single layer of Mo. A lower electrode CE1 of the storage capacitor Cst may be arranged on the same layer as a layer on which the gate electrode G1 is arranged. The lower electrode CE1 may include the same material as that of the gate electrode G1.

The storage capacitor Cst includes the lower electrode CE1 and an upper electrode CE2 that overlap each other with a first interlayer insulating layer 113 therebetween. The storage capacitor Cst may overlap a thin film transistor TFT. With regard to this, it is shown in FIG. 4A that the gate electrode G1 of the thin film transistor TFT serves as the lower electrode CE1 of the storage capacitor Cst. According to some example embodiments, the storage capacitor Cst may not overlap the thin film transistor TFT. The storage capacitor Cst may be covered by a second interlayer insulating layer 115.

The gate insulating layer 112 and the interlayer insulating layers, that is, the first interlayer insulating layer 113 and the second interlayer insulating layer 115, may include an inorganic insulating material such as silicon oxide, silicon nitride, silicon oxynitride, aluminum oxide, titanium oxide, tantalum oxide, and hafnium oxide. The gate insulating layer 112 and the interlayer insulating layers, that is, the first interlayer insulating layer 113 and the second interlayer insulating layer 115, may include a single layer or a multi-layer including the above materials.

A source electrode S1 and a drain electrode D1 may be arranged on the interlayer insulating layers, that is, the first interlayer insulating layer 113 and the second interlayer insulating layer 115.

The source electrode S1 and the drain electrode D1 may include a conductive material including Mo, Al, Cu, and Ti and may include a single layer or a multi-layer including the above materials. For example, the source electrode S1 and the drain electrode D1 may have a multi-layered structure of Ti/Al/Ti. The source electrode S1 and the drain electrode D1 may be connected to a source region or a drain region of the semiconductor layer A1 through a contact hole formed in the interlayer insulating layers, that is, the first interlayer insulating layer 113 and the second interlayer insulating layer 115.

A first planarization layer 117 and a second planarization layer 119 may be arranged on the source electrode S1 and the drain electrode D1. An organic light-emitting diode OLED may be arranged on the planarization layers, that is, the first planarization layer 117 and the second planarization layer 119.

An auxiliary electrode AE may be arranged between the first planarization layer 117 and the second planarization layer 119. Specifically, the auxiliary electrode AE may be arranged on the first planarization layer 117, and the second planarization layer 118 may be arranged on the auxiliary electrode AE to cover the auxiliary electrode AE. With this configuration, a pixel electrode 221 may be electrically connected to at least one of the source electrode S1 or the drain electrode D1 through the medium of the auxiliary electrode AE.

The auxiliary electrode AE may be connected to at least one of the source electrode S1 or the drain electrode D1 through a contact hole formed in the first planarization layer 117 and connected to the pixel electrode 221 described below through a contact hole formed in the second planarization layer 119. The auxiliary electrode AE may include a conductive material including Mo, Al, Cu, and Ti.

The planarization layers, that is, the first planarization layer 117 and the second planarization layer 119, may include a single layer or a multi-layer including an organic material and provide a flat top surface. In this case, the first planarization layer 117 and the second planarization layer 119 may include the same material or different materials.

The organic light-emitting diode OLED is arranged on the second planarization layer 119 in the display area DA of the substrate 100. The organic light-emitting diode OLED includes the pixel electrode 221, an intermediate layer 222, and the opposite electrode 223, the intermediate layer 222 including an organic emission layer.

The pixel electrode 221 may include a (semi) transmissive electrode or a reflective electrode. According to some example embodiments, the pixel electrode 221 may include a reflective layer and a transparent or semi-transparent electrode layer on the reflective layer, the reflective layer including Ag, Mg, Al, Pt, Pd, Au, Ni, Nd, Ir, Cr, and/or a compound thereof. The transparent or semi-transparent electrode layer may include at least one of indium tin oxide (ITO), zinc oxide (IZO), zinc oxide (ZnO), indium oxide ($In_2O_3$), indium gallium oxide (IGO), or aluminum zinc oxide (AZO). According to some example embodiments, the pixel electrode 221 may include ITO/Ag/ITO.

A pixel-defining layer 121 may be arranged on the second planarization layer 119, the pixel-defining layer 121 including at least one organic insulating material. The pixel-defining layer 121 defines an emission area of a pixel by including an opening corresponding to each of sub-pixels in the display area DA, that is, an opening OP exposing at least a central portion of the pixel electrode 221.

The intermediate layer 222 of the organic light-emitting diode OLED may include an organic emission layer. The organic emission layer may include an organic material including a fluorescent or phosphorous material emitting red, green, blue, or white light. The organic emission layer may include a low molecular weight organic material or a polymer organic material. A functional layer may be selectively further arranged on/under the organic emission layer, the functional layer including a hole transport layer (HTL), a hole injection layer (HIL), an electron transport layer (ETL), and an electron injection layer (EIL).

The opposite electrode 223 may include a transmissive electrode or a reflective electrode. According to some example embodiments, the opposite electrode 223 may include a transparent or semi-transparent electrode and include a metal thin layer having a small work function and including Li, Ca, LiF/Ca, LiF/Al, Al, Ag, Mg, and a compound thereof. Also, a transparent conductive oxide (TCO) layer such as ITO, IZO, ZnO, or $In_2O_3$ may be further arranged on the metal thin layer. The opposite electrode 223 may be arranged over the display area DA and the peripheral area PA and arranged on the intermediate layer 222 and the pixel-defining layer 121. The opposite electrode 223 may be formed as one body over a plurality of organic light-emitting diodes OLED and thus may correspond to a plurality of pixel electrodes 221.

Because the organic light-emitting diode OLED may be easily damaged by external moisture or oxygen, the organic light-emitting diode OLED may be covered and protected by an encapsulation substrate or a thin-film encapsulation layer.

As an example, in the case where the organic light-emitting diode OLED is protected by using an encapsulation substrate, a sealing member may be provided between the substrate 100 and the encapsulation substrate. The sealing member may be arranged in the peripheral area PA (see FIG. 1) to surround the display area DA (see FIG. 1) as described above. As an example, in the case where the organic light-emitting diode OLED is protected by using a thin-film encapsulation layer, the thin-film encapsulation layer may cover the display area DA (see FIG. 1) and extend to the outside of the display area DA (see FIG. 1). The thin-film encapsulation layer may include at least one organic encapsulation layer and at least one inorganic encapsulation layer.

Next, referring to a cross-section, shown in FIG. 4A, (referred to as a B-B' cross-section hereinafter) taken along the line B-B' of FIG. 3, the first fan-out line 30a of the B-B' cross-section may be arranged on the same layer as a layer on which the gate electrode G1 of the thin film transistor T1 or the lower electrode CE1 of the storage capacitor Cst is arranged. The second fan-out line 30b of the B-B' cross-section may be arranged between the first fan-out lines 30a that neighbor each other and arranged on a higher layer than a layer on which the first fan-out line 30a is arranged. The second fan-out line 30b may be arranged on the same layer as a layer on which the upper electrode CE2 of the storage capacitor Cst is arranged Therefore, the first interlayer insulating layer 113 may be arranged between the first fan-out line 30a and the second fan-out line 30b.

However, the embodiments are not limited thereto and both the first fan-out line 30a and the second fan-out line 30b may be arranged on the same layer. In this case, the first fan-out line 30a and the second fan-out line 30b may be arranged on the same layer as a layer on which the gate electrode G1 is arranged or the lower electrode CE1 or the upper electrode CE2 of the storage capacitor Cst is arranged.

In the B-B' cross-section, a thickness of each of the first fan-out line 30a and the second fan-out line 30b may be about 3,000 Å. Here, a 'thickness' denotes a length defined in a z-direction, which is a stacking direction, and 'the term 'thickness' is used in the same meaning also in the following description.

A first metal layer M1 is arranged over the second fan-out line 30*b* of the B-B' cross-section. The first metal layer M1 of the B-B' cross-section may be arranged on the same layer as a layer on which the source electrode S1 and the drain electrode D1 are arranged and may cover the fan-out lines, that is, the first fan-out line 30*a* and the second fan-out line 30*b*. Therefore, the second interlayer insulating layer 115 may be arranged between the first metal layer M1 and the second fan-out line 30*b*.

Because the first fan-out line 30*a* and the second fan-out line 30*b* are apart from each other in the B-B' cross-section, grooves G may be formed in the interlayer insulating layers, that is, the first interlayer insulating layer 113 and the second interlayer insulating layer 115, the grooves G corresponding to an intermediate area MA of the B-B' cross-section that is an area between the first fan-out line 30*a* and the second fan-out line 30*b*. Therefore, the grooves G may be also formed in the first metal layer M1 of the B-B' cross-section, the first metal layer M1 being arranged on the interlayer insulating layers, that is, the first interlayer insulating layer 113 and the second interlayer insulating layer 115.

The first metal layer M1 may include the same material as that of the source electrode S1 and the drain electrode D1 and have the same structure as that of the data line DL (see FIG. 2) and the driving voltage line PL (see FIG. 2). For example, the first metal layer M1 may include a single layer or a multi-layer including at least one of Al, Cu, Ti, or an alloy thereof. According to some example embodiments, the first metal layer M1 may have a three-layered structure of Ti/Al/Ti. In the B-B' cross-section, a thickness of the first metal layer M1 may be about 4,500 Å to about 9,000 Å and may be about 6,800 Å.

A second metal layer M2 is arranged over the first metal layer M1 in the B-B' cross-section. The second metal layer M2 of the B-B' cross-section is arranged on the same layer as a layer on which the auxiliary electrode AE is arranged and overlaps at least a portion of the first metal layer M1. In this case, like the first metal layer M1, the second metal layer M2 may cover the fan-out lines, that is, the first fan-out line 30*a* and the second fan-out line 30*b*. The second metal layer M2 may include the same material as that of the auxiliary electrode AE. For example, the second metal layer M2 may include a conductive material including Mo, Al, Cu, and Ti. In the B-B' cross-section, a thickness of the second metal layer M2 may be about 4,500 Å to about 9,000 Å and, more specifically, may be about 6,800 Å.

The second metal layer M2 may have the same structure as that of a portion of the second voltage line 20 (see FIG. 1) and/or the driving voltage line PL (see FIG. 2).

The first planarization layer 117 is arranged between the first metal layer M1 and the second metal layer M2. The first planarization layer 117 may fill the grooves G of the interlayer insulating layers, that is, the first interlayer insulating layer 113 and the second interlayer insulating layer 115 and may be formed as a thick layer having a relatively greater thickness than that of the first metal layer M1. Therefore, a region of the second metal layer M2 that corresponds to the groove G, that is, a region located right on the groove G, may be flat. In the B-B' cross-section, a thickness of the first planarization layer 117 may be about 10,000 Å to about 20,000 Å and more specifically, may be about 16,000 Å.

The first planarization layer 117 has a first contact hole CNT1 in the B-B' cross-section. The second metal layer M2 is connected to the first metal layer M1 through the first contact hole CNT1. According to some example embodiments, the first contact hole CNT1 of the B-B' cross-section may be apart in a width direction of the fan-out lines, that is, the first fan-out line 30*a* and the second fan-out line 30*b*, from the groove G of the first metal layer M1. Here, the 'width direction' denotes the first direction, which is a direction in which the fan-out lines, that is, the first fan-out line 30*a* and the second fan-out line 30*b*, are apart from each other in the peripheral area PA (see FIG. 1) of the substrate 100. The width direction is shown as an x-direction in FIG. 4A, etc. Hereinafter, a terminology of 'width direction' is used as a meaning of the x-direction, which is the first direction, and a terminology of 'width' is also used as a meaning of length in the x-direction.

A third metal layer M3 is arranged over the second metal layer M2 in the B-B' cross-section. The third metal layer M3 in the B-B' cross-section is arranged on the same layer as a layer on which the opposite electrode 223 is arranged, the third metal layer M3 overlapping at least a portion of the second metal layer M2. In this case, like the first metal layer M1 and the second metal layer M2, the third metal layer M3 may cover the fan-out lines, that is, the first fan-out line 30*a* and the second fan-out line 30*b*.

According to some example embodiments, the third metal layer M3 may be formed as one body with the opposite electrode 223. In this case, the third metal layer M3 may cover an entire surface of the display area DA (see FIG. 1) and at least a portion of the peripheral area PA (see FIG. 1) and may include the same material as that of the opposite electrode 223. Therefore, in the B-B' cross-section, like the opposite electrode 223, the third metal layer M3 may include a thin film layer having a thickness of about 100 Å.

According to some example embodiments, the third metal layer M3 may include a metal layer connected to the opposite electrode 223. In this case, a connection metal layer for connecting the third metal layer M3 to the opposite electrode 223 may be further provided.

The second planarization layer 119 is arranged between the second metal layer M2 and the third metal layer M3. In the cross-section B-B', the second planarization layer 119 may fill the first contact hole CNT1 of the first planarization layer 117 and may be formed as a thick layer having a relatively greater thickness than that of the second metal layer M2. Therefore, a region of the third metal layer M3 that corresponds to the first contact hole CNT1, that is, a region located right on the first contact hole CNT1, may be flat.

The second planarization layer 119 has a second contact hole CNT2 in the B-B' cross-section. The third metal layer M3 is connected to the second metal layer M2 through the second contact hole CNT2. According to some example embodiments, the second contact hole CNT2 in the B-B' cross-section is arranged between the first contact holes CNT1 that neighbor each other among the first contact holes CNT1 of the first planarization layer 117. Simultaneously, the second contact hole CNT2 may be apart in the first direction (the x-direction), which is a width direction of the fan-out lines, that is, the first fan-out line 30*a* and the second fan-out line 30*b*, from the groove G. That is, a separation distance in the first direction (the x-direction) between the first contact hole CNT1 and the groove G may be different from a separation distance in the first direction (the x-direction) between the second contact hole CNT2 and the groove G.

Equal to or similar to the first planarization layer 117, a thickness of the second planarization layer 119 in the B-B' cross-section may be about 10,000 Å to about 20,000 Å and more specifically, may be about 16,000 Å.

The first planarization layer 117 and/or the second planarization layer 119 may include an organic insulating material. According to some example embodiments, the first planarization layer 117 and/or the second planarization layer 119 may include a flexible and dense material such as polyimide.

As described above, in the B-B' cross-section, because the first contact hole CNT1 and the second contact hole CNT2 are alternately arranged in a width direction (e.g. the first direction (the x-direction)) of the fan-out lines, that is, the first fan-out line 30a and the second fan-out line 30b, the first contact hole CNT1 and the second contact hole CNT2 are alternately arranged in a plan view (that is, on an xy-plane) as shown in FIG. 3.

Referring to FIGS. 3 and 4B, a plurality of holes OG that are apart from each other may be arranged in the second metal layer M2 of a cross-section C-C', and the plurality of holes OG may help outgassing of the first planarization layer 117 including an organic material. For this purpose, the plurality of holes OG may have a size greater than sizes of the plurality of first contact holes CNT1 and the plurality of second contact holes CNT2. That is, a width w3 of the hole OG of the second metal layer M2 may be greater than a width w2 of the second contact hole CNT2 of the second planarization layer 119 and a width w1 of the first contact hole CNT1.

Though it is shown in FIGS. 3 and 4B that the width w2 of the second contact hole CNT2 of the second planarization layer 119 is the same as the width w1 of the first contact hole CNT1, the embodiments are not limited thereto.

As shown in FIG. 3, the plurality of holes OG, the first contact hole CNT1, and the second contact hole CNT2 may have a quadrangular shape. According to some example embodiments, the width w3 of the plurality of holes OG may be about 17.5 μm, the width w1 of the first contact hole CNT1 and the width w2 of the second contact hole CNT2 may be each about 6 μm. However, the embodiments are not limited thereto and the plurality of holes OG, the first contact hole CNT1, and the second contact hole CNT2 may have various shapes such as a polygonal shape, an elliptical shape, and a circular shape in addition to a quadrangular shape.

Also, the plurality of holes OG of the second metal layer M2 may be apart from the first contact holes CNT1 of the first planarization layer 117, and the second contact holes CNT2 of the second planarization layer 119 may be apart from the first contact holes CNT1 and the plurality of holes OG. That is, a separation distance in the first direction (the x-direction) between the first contact hole CNT1 and the second metal layer M2 may be different from a separation distance in the first direction (the x-direction) between the second contact hole CNT2 and the second metal layer M2.

Therefore, the plurality of first contact holes CNT1, the plurality of second contact holes CNT2, and the plurality of holes OG may be alternately arranged in a plan view (that is, on the xy-plane).

Figure 5:
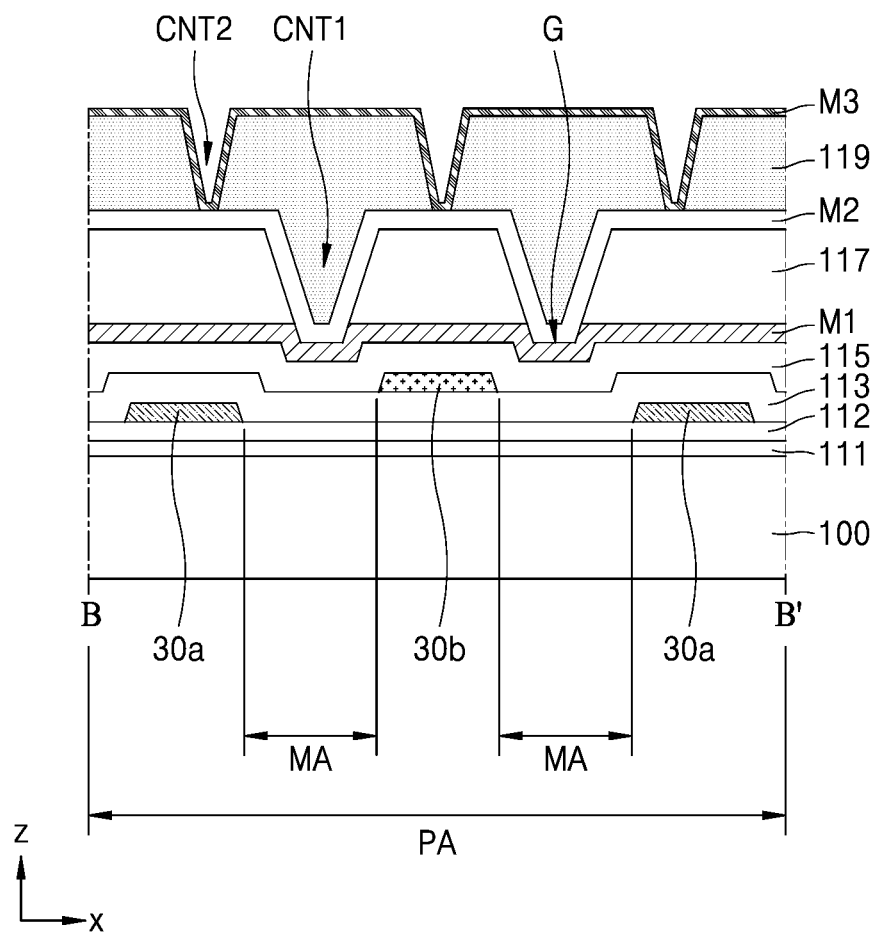
FIG. 5 is a cross-sectional view of a portion of a display device according to some example embodiments.

FIG. 5 is a cross-sectional view of a portion of a display device according to another embodiment.

The embodiment shown in FIG. 5 is only different from the embodiment shown in FIG. 4A in the location of the first contact hole CNT1 defined in the first direction (the x-direction) and has a structure that is the same as or similar to that of the embodiment shown in FIG. 4A. Therefore, the embodiment shown in FIG. 5 is described with attention to a difference from the embodiment shown in FIG. 4A. Also, because a lower configuration of the first metal layer M1 shown in FIG. 5 is the same as that of the embodiment shown in FIG. 4A, description thereof is omitted.

Referring to FIG. 5, the second metal layer M2 is arranged over the first metal layer M1. The second metal layer M2 is arranged on the same layer as a layer on which the auxiliary electrode AE (see FIG. 4A) is arranged. The second metal layer M2 overlaps at least a portion of the first metal layer M1. In this case, like the first metal layer M1, the second metal layer M2 may also cover the fan-out lines, that is, the first fan-out line 30a and the second fan-out line 30b. The first metal layer M1 is arranged on the same layer as a layer on which the source electrode S1 and the drain electrode D1 (see FIG. 4A) of the thin film transistor T1 (see FIG. 4A) are arranged as described above.

The first planarization layer 117 is arranged between the first metal layer M1 and the second metal layer M2. The first planarization layer 117 includes the first contact hole CNT1. The second metal layer M2 is connected to the first metal layer M1 through the first contact hole CNT1. According to some example embodiments, the first contact hole CNT1 may be located to correspond to the groove G of the interlayer insulating layers, that is, the first interlayer insulating layer 113 and the second interlayer insulating layer 115. Therefore, a portion of the second metal layer M2 that covers an inner surface of the first contact hole CNT1 may contact a portion of the first metal layer M1 that covers an inner surface of the groove G. Therefore, the first contact hole CNT1 of the first planarization layer 117 and the grooves G of the first interlayer insulating layer 113 and the second interlayer insulating layer 115 may be located in the intermediate area MA, which is an area between the first fan-out line 30a and the second fan-out line 30b.

The third metal layer M3 is arranged over the second metal layer M2. The third metal layer M3 is arranged on the same layer as a layer on which the opposite electrode 223 (see FIG. 4A) is arranged. The third metal layer M3 overlaps at least a portion of the second metal layer M2. In this case, like the first metal layer M1 and the second metal layer M2, the third metal layer M3 may be arranged to also cover the fan-out lines, that is, the first fan-out line 30a and the second fan-out line 30b.

The second planarization layer 119 is arranged between the second metal layer M2 and the third metal layer M3. The second planarization layer 119 may fill the first contact hole CNT1 of the first planarization layer 117 and may be formed as a thick layer having a relatively greater thickness than that of the second metal layer M2. Therefore, a region of the third metal layer M3 that corresponds to the groove G and the first contact hole CNT1 may be flat.

The second planarization layer 119 has the second contact hole CNT2. The third metal layer M3 is connected to the second metal layer M2 through the second contact hole CNT2. According to some example embodiments, the second contact hole CNT2 is arranged between the first contact holes CNT1 that neighbor each other among the first contact holes CNT1 of the first planarization layer 117.

According to some example embodiments, because the first contact hole CNT1 of the first planarization layer 117 is located to correspond to the groove G of the interlayer insulating layers, that is, the first interlayer insulating layer 113 and the second interlayer insulating layer 115, the second contact hole CNT2 of the second planarization layer 119 may be apart from the first contact hole CNT1 and the groove G in the first direction (the x-direction), which is the width direction of the fan-out lines, that is, the first fan-out line 30a and the second fan-out line 30b, the first contact hole CNT1 and the groove G overlapping each other.

Figure 6:
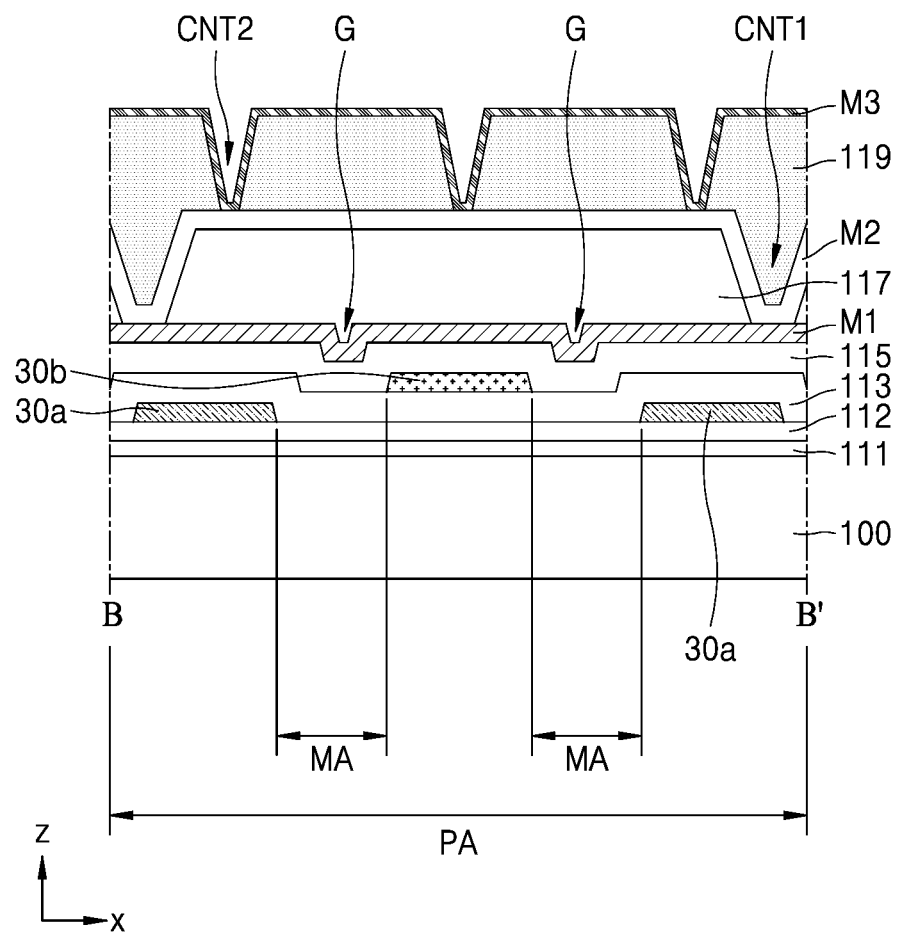
FIG. 6 is a cross-sectional view of a portion of a display device according to some example embodiments.

FIG. 6 is a cross-sectional view of a portion of a display device according to another embodiment.

The embodiment shown in FIG. 6 is only different from the embodiment shown in FIG. 4A in the location of the first contact hole CNT1 defined in the first direction (the x-direction) and has a structure that is the same as or similar to that of the embodiment shown in FIG. 4A. Therefore, the embodiment shown in FIG. 6 is described with attention to a difference from the embodiment shown in FIG. 4A. Also, because a lower configuration of the first metal layer M1 shown in FIG. 6 is the same as that of the embodiment shown in FIG. 4A, some repetitive description thereof is omitted.

Referring to FIG. 6, the second metal layer M2 is arranged over the first metal layer M1. The second metal layer M2 is arranged on the same layer as a layer on which the auxiliary electrode AE (see FIG. 4A) is arranged. The second metal layer M2 overlaps at least a portion of the first metal layer M1. In this case, like the first metal layer M1, the second metal layer M2 may also cover the fan-out lines, that is, the first fan-out line 30a and the second fan-out line 30b. The first metal layer M1 is arranged on the same layer as a layer on which the source electrode S1 and the drain electrode D1 (see FIG. 4A) of the thin film transistor T1 (see FIG. 4A) are arranged as described above.

The first planarization layer 117 is arranged between the first metal layer M1 and the second metal layer M2. The first planarization layer 117 includes the first contact hole CNT1. The second metal layer M2 is connected to the first metal layer M1 through the first contact hole CNT1. According to some example embodiments, a plurality of grooves G of the interlayer insulating layers, that is, the first interlayer insulating layer 113 and the second interlayer insulating layer 115, may be located between the first contact holes CNT1 that neighbor each other. That is, unlike the embodiment shown in FIG. 4A, the first contact hole CNT1 and the groove G are not alternately arranged one by one in the first direction (the x-direction). Therefore, according to some example embodiments, the number of first contact holes CNT1 over the fan-out lines, that is, the first fan-out line 30a and the second fan-out line 30b may be less than the number of first contact holes CNT1 of the embodiment shown in FIG. 4A. However, the embodiments are not limited thereto. According to some example embodiments, the first contact holes CNT1 may have a wide distribution in some of regions over the fan-out lines, that is, the first fan-out line 30a and the second fan-out line 30b, and the first contact holes CNT1 may have a dense distribution in some of regions over the fan-out lines, that is, the first fan-out line 30a and the second fan-out line 30b.

The third metal layer M3 is arranged over the second metal layer M2. The third metal layer M3 is arranged on the same layer as a layer on which the opposite electrode 223 is arranged. The third metal layer M3 overlaps at least a portion of the second metal layer M2. In this case, like the first metal layer M1 and the second metal layer M2, the third metal layer M3 may be arranged to also cover the fan-out lines, that is, the first fan-out line 30a and the second fan-out line 30b.

The second planarization layer 119 is arranged between the second metal layer M2 and the third metal layer M3. The second planarization layer 119 may fill the first contact hole CNT1 of the first planarization layer 117 and may be formed as a thick layer having a relatively greater thickness than that of the second metal layer M2. Therefore, a region of the third metal layer M3 that corresponds to the groove G and the first contact hole CNT1 may be flat.

The second planarization layer 119 has the second contact hole CNT2. The third metal layer M3 is connected to the second metal layer M2 through the second contact hole CNT2. The second contact hole CNT2 is arranged between the first contact holes CNT1 that neighbor each other among the first contact holes CNT1 of the first planarization layer 117. As described above, because an interval between the first contact holes CNT1 increases compared to that of the previous embodiment (see FIGS. 4A and 5, etc.), the number of second contact holes CNT2 arranged between the first contact holes CNT1 that neighbor each other may be also the plural number.

According to some example embodiments, like the embodiment shown in FIG. 4A, the first contact hole CNT1 of the first planarization layer 117 may be apart from the groove G of the interlayer insulating layers, that is, the first interlayer insulating layer 113 and the second interlayer insulating layer 115, and the second contact hole CNT2 of the second planarization layer 119 in the first direction (the x-direction), which is the width direction of the fan-out lines, that is, the first fan-out line 30a and the second fan-out line 30b.

Figure 7:
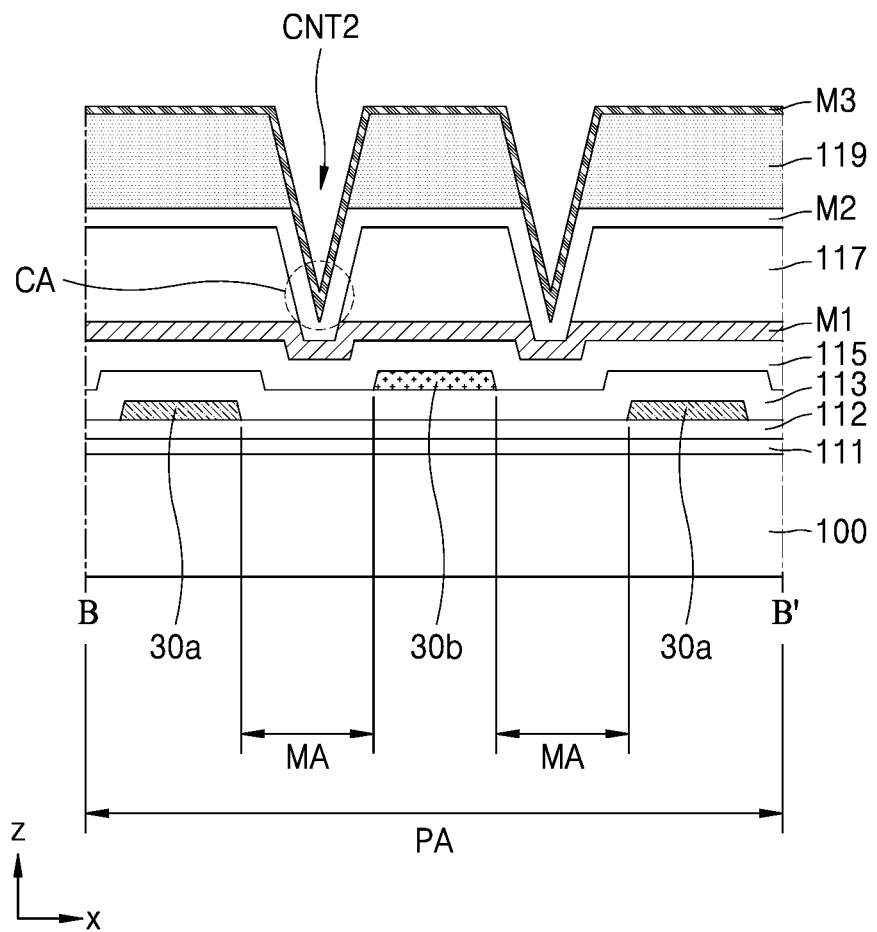
FIG. 7 is a plan view of a portion of a display device according to some example embodiments.

FIG. 7 is a plan view of a portion of a display device according to a comparative example.

Referring to FIG. 7, in the display device according to a comparative example, the first contact hole CNT1 of the first planarization layer 117 and the second contact hole CNT2 of the second planarization layer 119 may be located to correspond to the groove G of the interlayer insulating layers, that is, the first interlayer insulating layer 113 and the second interlayer insulating layer 115.

In this case, a portion of the third metal layer M3 that covers an inner surface of the second contact hole CNT2 may contact a portion of the second metal layer M2 that covers an inner surface of the first contact hole CNT1, and a portion of the second metal layer M2 that covers an inner surface of the first contact hole CNT1 may contact a portion of the first metal layer M1 that covers an inner surface of the groove G. With this configuration, the first metal layer M1, the second metal layer M2, and the third metal layer M3 contact each other at an approximately same location.

As shown in FIG. 7, in the stacking structure including both the first planarization layer 117 and the second planarization layer 119 having a relatively greater thickness than those of other inorganic insulating layers 112, 113, and 115, because a portion CA in which the third metal layer M3 contacts the first metal layer M1 and the second metal layer M2 has a thin thickness, the portion CA may be fragile considerably. This is because the third metal layer M3 extends long along an inner surface of the first contact hole CNT1 formed in the first planarization layer 117 and an inner surface of the second contact hole CNT2 formed in the second planarization layer 119, and the third metal layer M3 having a thin thickness of about 100 Å may be easily disconnected.

In this case, when the third metal layer M3 is disconnected, the second metal layer M2, which is a layer under the third metal layer M3, is exposed, which causes the disconnection of the second metal layer M2 that may be used as the second voltage line 20 (see FIG. 2). Therefore, certain undesired characteristics, such as heating, may occur in the display device.

Figure 8:
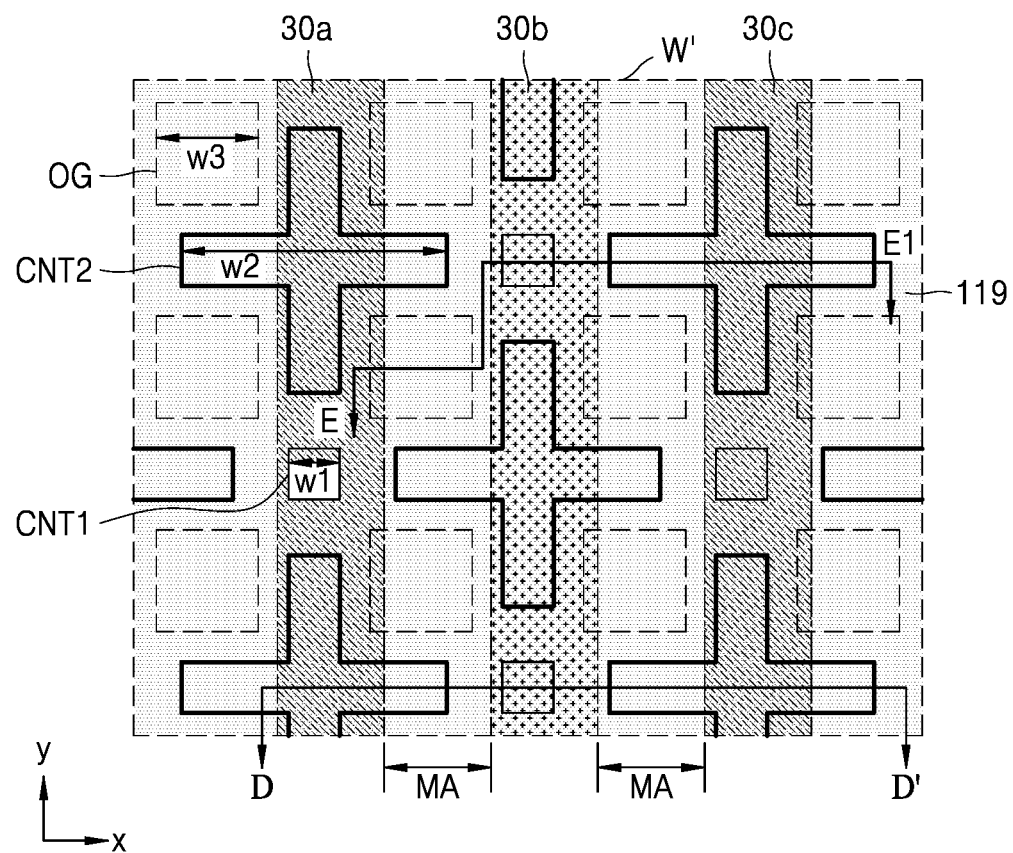
FIG. 8 is an enlarged plan view of another example of a region W of FIG. 1.
Figure 9A:
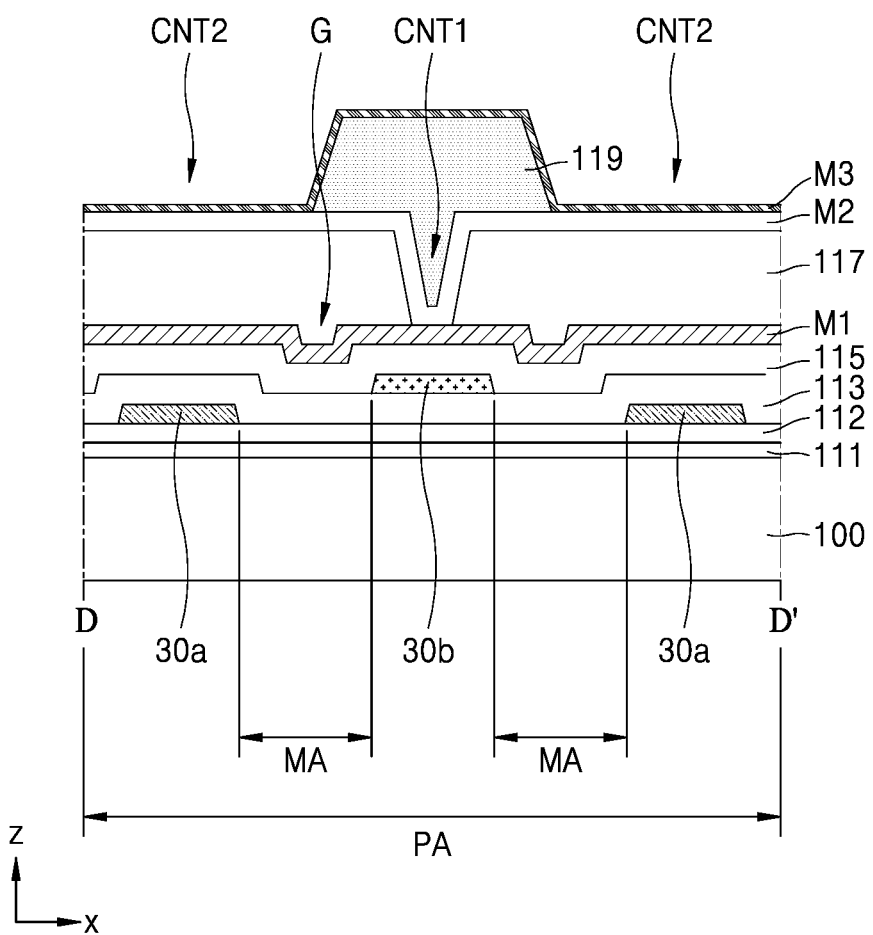
FIG. 9A is a cross-sectional view of the display device taken along the line D-D' of FIG. 8.
Figure 9B:
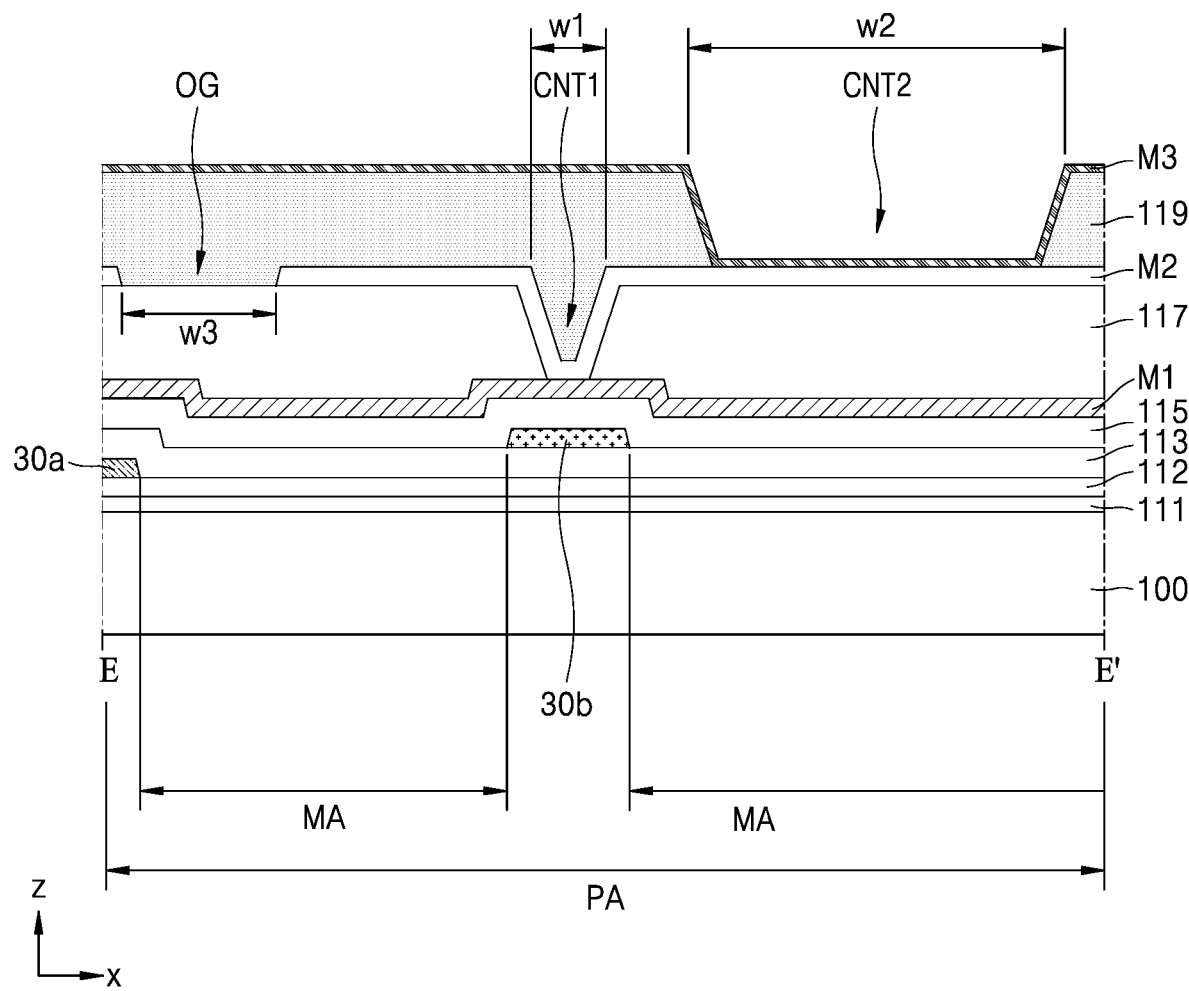
FIG. 9B is a cross-sectional view of the display device taken along the line E-E' of FIG. 8.

FIG. 8 is an enlarged plan view of a display device according to some example embodiments, FIG. 9A is a cross-sectional view of the display device taken along the line D-D' of FIG. 8, and FIG. 9B is a cross-sectional view of the display device taken along the line E-E' of FIG. 8.

The embodiment shown in FIGS. 8 and 9A is only different from the embodiment shown in FIGS. 3, 4A, and 4B in the size and shape of the second contact hole CNT2 and has a structure that is the same as or similar to that of the embodiment shown in FIGS. 3, 4A, and 4B. Therefore, the embodiment shown in FIGS. 8, 9A, and 9B is described with attention to a difference from the embodiment shown in FIGS. 3, 4A, and 4B.

Referring to FIGS. 8, 9A, and 9B, the width w2 of the second contact hole CNT2 of the second planarization layer 119 may be greater than the width w1 of the first contact hole CNT1 of the first planarization layer 117. In this case, as shown in FIG. 9A, the first contact hole CNT1 may be arranged between the second contact holes CNT2 that neighbor each other. Also, the first contact hole CNT1 may be arranged between the grooves G that neighbor each other among the grooves G of the interlayer insulating layers, that is, the first interlayer insulating layer 113 and the second interlayer insulating layer 115. However, the embodiments are not limited thereto and, as shown in FIG. 5, the first contact hole CNT1 and the groove G may overlap each other.

As described above, according to some example embodiments, because a contact area between the third metal layer M3 and the second metal layer M2 increases compared to that of the previous embodiments (see FIGS. 3, 4A, and 4B), an initialization voltage and/or a driving voltage may be more stably transferred to each pixel P (see FIG. 1).

Though it is shown in FIGS. 8 and 9B that the width w2 of the second contact hole CNT2 of the second planarization layer 119 is greater than the width w3 of the hole OG of the second metal layer M2, the embodiments are not limited thereto. That is, the width w2 of the second contact hole CNT2 may have a value between the width w3 of the hole OG of the second metal layer M2 and the width w1 of the first contact hole CNT1.

According to some example embodiments, because the first contact hole CNT1 and the second contact hole CNT2 are alternately arranged in a plan view (that is, on the xy-plane), and the width w2 of the second contact hole CNT2 is greater than the width w1 of the first contact hole CNT1, the number of first contact holes CNT1 may be reduced compared to the previous embodiments. However, according to some example embodiments, the distribution of the first contact holes CNT1 may be low in some of regions and the first contact holes CNT1 may be densely distributed in other regions.

Though it is shown in FIG. 8 that the second contact hole CNT2 has a cross shape, this is provided as an example and the second contact hole CNT2 may be modified in various shapes.

According to some example embodiments of the present disclosure, the occurrence of disconnection of a wiring or a contact defect may be prevented.

Also, a ratio of the display area may be increased by reducing the peripheral area outside the display area.

However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
    a substrate including a display area, a peripheral area, and a pad area outside the peripheral area, a plurality of pixels in the display area, and the peripheral area surrounding the display area;
    a plurality of fan-out lines extending from the pad area to the display area across the peripheral area, the plurality of fan-out lines being configured to transfer an image signal to the plurality of pixels;
    a first metal layer covering at least a portion of the plurality of fan-out lines in the peripheral area;
    a second metal layer overlapping at least a portion of the first metal layer, the second metal layer being over the first metal layer;
    a third metal layer over the second metal layer in the peripheral area;
    a first insulating layer between the first metal layer and the second metal layer and including first contact holes;
    a second insulating layer between the second metal layer and the third metal layer and including second contact holes; and
    a third insulating layer between the plurality of fan-out lines and the first metal layer,
    wherein the first metal layer and the second metal layer contact each other in the first contact hole, the second metal layer and the third metal layer contact each other in the second contact hole.

2. The display device of claim 1,
    wherein the second contact holes are between the first contact holes that neighbor each other.

3. The display device of claim 1, wherein
    the third insulating layer has grooves, the grooves corresponding to an intermediate area between neighboring the plurality of fan-out lines, and
    the first contact holes are in between neighboring the grooves.

4. The display device of claim 1, wherein
    the third insulating layer has grooves, the grooves corresponding to an intermediate area between neighboring the plurality of fan-out lines, and
    the first metal layer and the second metal layer contact each other in the grooves.

5. The display device of claim 1, wherein at least one of the first insulating layer or the second insulating layer includes an organic insulating material.

6. The display device of claim 1, wherein
    the second metal layer includes a plurality of holes apart from the first contact holes, and
    the second contact holes are apart from each of the first contact holes and the plurality of holes.

7. The display device of claim 6, wherein the plurality of holes have a size greater than those of the first contact holes and the second contact holes.

8. The display device of claim 1, wherein the first contact holes have an area greater than those of the second contact holes.

9. The display device of claim 1, wherein
    the plurality of pixels include:
    a thin film transistor;

a pixel electrode electrically connected to at least one of a source electrode or a drain electrode of the thin film transistor;

an opposite electrode over the pixel electrode; and an emission layer between the pixel electrode and the opposite electrode.

10. The display device of claim 9, wherein the third metal layer constitutes one body with the opposite electrode.

11. The display device of claim 9, wherein the first metal layer is on the same layer as a layer on which the source electrode and the drain electrode of the thin film transistor are arranged.

12. The display device of claim 9, wherein at least some of the plurality of fan-out lines are on the same layer as a layer on which a gate electrode of the thin film transistor is arranged.

13. The display device of claim 9, further comprising:

an auxiliary metal connecting the pixel electrode to at least one of the source electrode or the drain electrode of the thin film transistor, wherein the second metal layer is on the same layer as a layer on which the auxiliary metal is arranged.

14. The display device of claim 1, wherein the plurality of fan-out lines include a first fan-out line and a second fan-out line, the first fan-out line and the second fan-out line being on different layers.

15. A display device comprising:

a substrate including a display area, a peripheral area, and a pad area outside the peripheral area, a plurality of pixels in the display area, and the peripheral area surrounding the display area;

a plurality of fan-out lines extending from the pad area to the display area across the peripheral area, the plurality of fan-out lines being apart from each other in a first direction in the peripheral area;

a first metal layer covering at least a portion of the plurality of fan-out lines in the peripheral area;

a second metal layer overlapping at least a portion of the first metal layer, the second metal layer being over the first metal layer in the peripheral area;

an opposite electrode in common over the plurality of pixels, the opposite electrode being over the second metal layer;

a first insulating layer between the first metal layer and the second metal layer and including first contact holes;

a second insulating layer between the second metal layer and the opposite electrode and including second contact holes; and a third insulating layer between the plurality of fan-out lines and the first metal layer and including grooves corresponding to an intermediate area between the plurality of fan-out lines that neighbor each other, wherein a separation distance in a first distance between the first contact holes and the grooves is different from a separation distance in the first direction between the second contact holes and the grooves.

16. The display device of claim 15, wherein the second metal layer includes a plurality of holes apart from each other, and a separation distance in the first direction between the first contact holes and the plurality of holes is different from a separation distance in the first direction between the second contact holes and the plurality of holes.

17. The display device of claim 16, wherein the plurality of fan-out lines include a first fan-out line and a second fan-out line, the first fan-out line and the second fan-out line being on different layers.

18. The display device of claim 15, wherein the plurality of pixels include:

a thin film transistor;

a pixel electrode electrically connected to at least one of a source electrode or a drain electrode of the thin film transistor; and an emission layer between the pixel electrode and the opposite electrode.

19. The display device of claim 18, wherein the first metal layer is on the same layer as a layer on which the source electrode and the drain electrode of the thin film transistor are arranged.

20. The display device of claim 18, wherein at least some of the plurality of fan-out lines are on the same layer as a layer on which a gate electrode of the thin film transistor is arranged.

21. The display device of claim 18, further comprising:

an auxiliary electrode connecting the pixel electrode to at least one of the source electrode or the drain electrode of the thin film transistor, wherein the second metal layer is on the same layer as a layer on which the auxiliary electrode is arranged.

* * * * *